(12) United States Patent
Sikri (10) Patent No.: US 8,861,653 B2
(45) Date of Patent: Oct. 14, 2014

(54) DEVICES AND METHODS FOR OBTAINING AND USING A PRIORI INFORMATION IN DECODING CONVOLUTIONAL CODED DATA

(75) Inventor: Divaydeep Sikri, Farnborough (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/464,695

(22) Filed: May 4, 2012

(65) Prior Publication Data

US 2013/0294551 A1 Nov. 7, 2013

(51) Int. Cl.
H04L 27/06 (2006.01)

(52) U.S. Cl.
USPC ........................................ 375/341

(58) Field of Classification Search
USPC ........... 375/265, 340, 341; 755/752, 755, 758
See application file for complete search history.

(56) References Cited

U.S. PATENT DOCUMENTS

| 5,327,441 | A | 7/1994 | Kawazoe et al. | |
|---|---|---|---|---|
| 7,965,761 | B2 | 6/2011 | Shattil | |
| 8,077,813 | B2 | 12/2011 | Furman et al. | |
| 2002/0015451 | A1* | 2/2002 | Nafie et al. | 375/262 |
| 2005/0091566 | A1* | 4/2005 | Berens et al. | 714/755 |
| 2009/0175389 | A1* | 7/2009 | Huang et al. | 375/341 |
| 2010/0158161 | A1 | 6/2010 | Sambhwani et al. | |
| 2010/0185923 | A1 | 7/2010 | Chappaz | |
| 2010/0272011 | A1 | 10/2010 | Palanki et al. | |
| 2011/0051831 | A1 | 3/2011 | Subrahmanya et al. | |
| 2011/0131465 | A1 | 6/2011 | Eroz et al. | |
| 2011/0167322 | A1 | 7/2011 | Parthasarathy et al. | |
| 2011/0194571 | A1 | 8/2011 | Ozluturk et al. | |
| 2011/0283162 | A1* | 11/2011 | Murakami | 714/758 |
| 2013/0294550 | A1 | 11/2013 | Sikri | |

FOREIGN PATENT DOCUMENTS

| GB | 2358767 A | 8/2001 |
|---|---|---|
| WO | 2005069526 A1 | 7/2005 |

OTHER PUBLICATIONS

"Digital cellular telecommunications system (Phase 2+); Channel coding (3GPP TS 45.003 version 4.0.0 Release 4); ETSI TS 145 003", IEEE, LIS, Sophia Antipolis Cedex, France, vol. 3-G1, No. V4.0.0, Jan. 1, 2001, XP014010658, ISSN: 0000-0001 p. 114.
Digital cellular telecommunications system (Phase 2+); Channel coding (3GPP TS 45.003 version 9.0.0 Release 9), ETSI TS 145 003 V9.0.0 (Feb. 2010), pp. 1-322.

(Continued)

Primary Examiner — Sam K Ahn
Assistant Examiner — Syed Haider
(74) Attorney, Agent, or Firm — QUALCOMM IP Department; James Hunt Yancey, Jr.

(57) ABSTRACT

Decoders and communications devices including such decoders can obtain a convolutional coded bit stream including a plurality of coded data bits. The convolutional coded bit stream may be coded according to one or more generator polynomials such that each information bit is related to two or more coded data bits in a manner to be determinable from a mathematical combination of the two or more coded data bits of the convolutional coded bit stream. A priori information associated with each information bit can be calculated based at least in part on the mathematical combination of the two or more coded data bits. Employing the a priori information, a binary value for each information bit can be calculated. Other aspects, embodiments, and features are also claimed and described.

15 Claims, 4 Drawing Sheets

(56) References Cited

OTHER PUBLICATIONS

Gnanasekaran, et al., "Modified Soft Output Viterbi Error Correcting Algorithm," IJCSNS International Journal of Computer Science and Network Security, vol. 8, No. 9, Sep. 2008, pp. 161-165.

International Search Report and Written Opinion—PCT/US2013/039224—ISA/EPO—Jul. 25, 2013.

Kang K.M., et al., "Modulo-Type Viterbi Decoder for High-Speed Digital Transmission Systems", IEEE Communications Letters, IEEE Service Center, Piscataway, NJ, US, vol. 4, No. 2, Feb. 1, 2000, pp. 68-70, XP011083852, ISSN: 1089-7798, DOI: 10.1109/4234.824759.

Notification of Transmittal of the International Preliminary Report on Patentability; International Preliminary Examining Authority; May 13, 2014; (PCT/US2013/039224).

* cited by examiner

DEVICES AND METHODS FOR OBTAINING AND USING A PRIORI INFORMATION IN DECODING CONVOLUTIONAL CODED DATA

TECHNICAL FIELD

Aspects of the present disclosure relate generally to communication systems, and more particularly, to devices and methods adapted to facilitate determining a priori information usable for decoding convolutional coded data.

BACKGROUND

Within a typical digital communications system, information is represented as a sequence of binary bits (e.g., ones and zeros). To transmit the information, the binary bits are modulated onto an analogue signal waveform, and transmitted over a communications channel. The communications channel may introduce noise and interference that can corrupt the transmitted signal. At the receiver, the corrupted received signal is mapped back into the digital domain, although bit errors may result due to the introduced noise.

To compensate for bit errors, channel coding is often used in digital communications systems to allow for error detection and correction to occur. Channel coding is often accomplished by selectively introducing redundant bits into the transmitted bit stream. These redundant bits allow detection and correction of bit errors in a received bit stream.

One type of channel code includes convolutional codes. Convolutional codes are one of the most widely used channel codes in practical communications systems. The ratio between the number of input bits and the number of output bits is called the code rate. For instance, a convolutional coder which calculates two output bits for each input bit is typically referred to as a half-rate convolutional coder. Similarly, a convolutional coder which calculates three output bits for each input bit is typically referred to as a one-third-rate convolutional coder.

When a bit stream is convolutional coded, the communicating entities may each employ a decoder that implements a Viterbi algorithm. The Viterbi algorithm provides the statistical maximum likelihood decoding. Such maximum likelihood decoding is especially valuable when signal quality is low.

BRIEF SUMMARY OF SOME EXEMPLARY EMBODIMENTS

Although a Viterbi decoder can be effective in accurately decoding a convolutional coded bit stream, a Viterbi algorithm can benefit from employing a priori information in decoding a coded bit stream. Thus, it may be beneficial to enable communications devices to employ decoders capable of determining a priori information that may be employed for decoding a convolutional coded bit stream.

Various aspects of the present disclosure provide devices and methods adapted to determine a priori information employable for decoding convolutional coded data. One or more aspects provide decoders adapted to decode a convolutional coded bit stream. According to at least one example, such decoders may include an a priori decoding component and a Viterbi decoding component. The a priori decoding component can be adapted to obtain a plurality of coded data bits from a bit stream that is convolutional coded according to one or more generator polynomials such that each information bit is determinable from a mathematical combination of two or more of the coded data bits. The a priori decoding component may further be adapted to determine a priori information associated with each information bit based at least in part on the mathematical combination of the two or more coded data bits. The Viterbi decoding component may be adapted to employ the a priori information in calculating a binary value for each information bit.

Additional aspects of the present disclosure provide communications devices adapted to facilitate decoding of convolutional coded data. According to one or more examples, such communications devices may include a communications interface and a storage medium coupled to a processing circuit. The processing circuit may include a decoder adapted to receive via the communications interface a bit stream including a plurality of coded data bits. The bit stream can be convolutional coded such that each information bit is related to two or more coded data bits in a manner to be determinable from a mathematical combination of the two or more coded data bits of the convolutional coded bit stream, where the mathematical combination includes modulo 2 addition, multiplication, and/or division. The decoder may further determine a priori information associated with each information bit based at least in part on the mathematical combination of the two or more coded data bits. The decoder may also calculate a binary value for each information bit using at least in part the a priori information.

Further aspects of the present disclosure provide methods operational on a communications device and/or a communications device including means for performing such methods. One or more examples of such methods may include receiving a bit stream including a plurality of coded data bits, where the bit stream is convolutional coded such that each information bit is related to two or more coded data bits in a manner to be determinable from a mathematical combination of the two or more coded data bits of the convolutional coded bit stream. The mathematical combination may include modulo 2 addition, multiplication, and/or division of the two or more coded data bits. A priori information associated with each information bit may be determined based at least in part on the mathematical combination of the two or more coded data bits. A binary value for each information bit may be calculated using at least in part the a priori information.

Still additional aspects of the present disclosure provide machine-readable mediums comprising instructions operational on a communications device. According to one or more examples, such instructions may cause a processor to obtain a bit stream including a plurality of coded data bits, where the bit stream is convolutional coded such that each information bit is related to two or more coded data bits in a manner to be determinable from a mathematical combination of the two or more coded data bits. The mathematical combination can include modulo 2 addition, multiplication, and/or division of the two or more coded data bits. The instructions may further cause the processor to determine a priori information associated with each information bit based at least in part on the mathematical combination of the two or more coded data bits. Furthermore, the instructions may cause the processor to calculate a binary value for each information bit using at least in part the a priori information.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form in order to avoid obscuring the described concepts and features.

Figure 1:
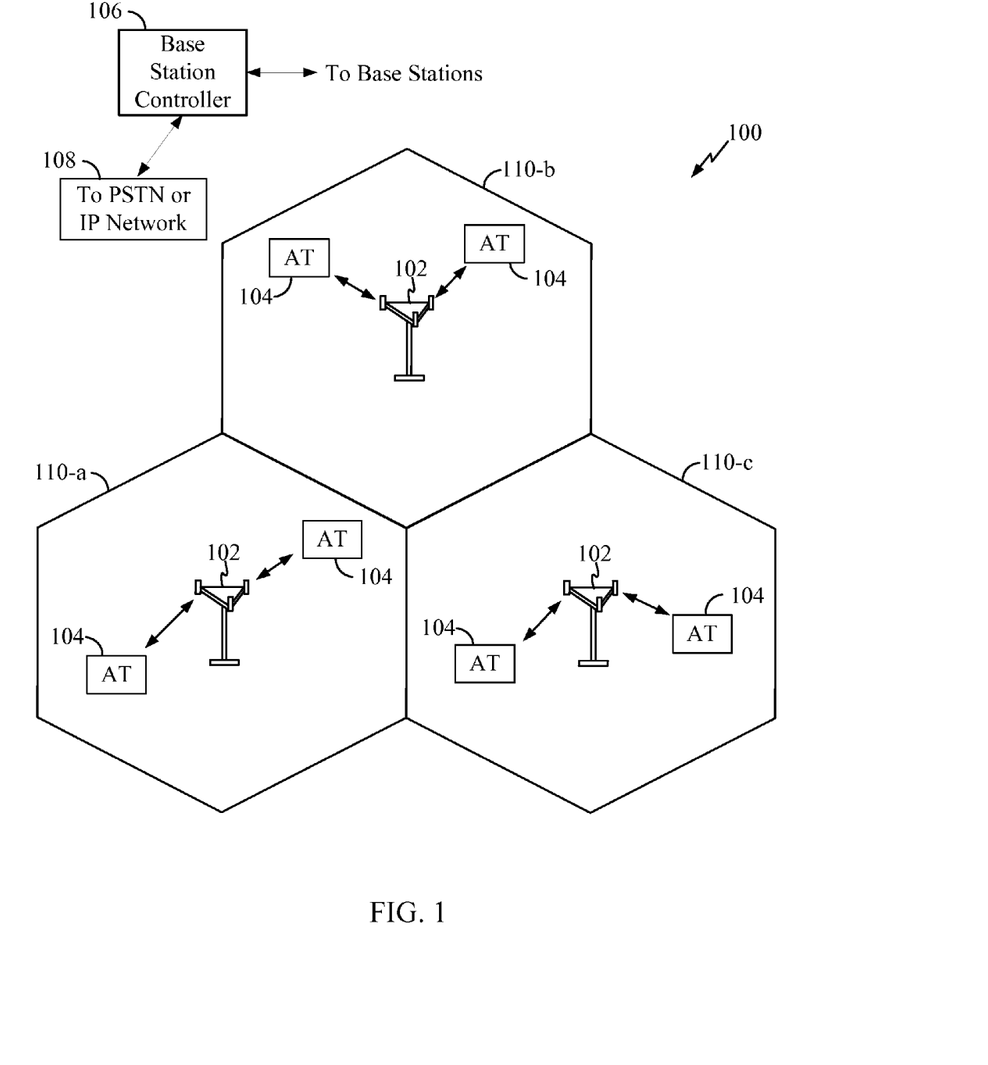
FIG. 1 is a block diagram illustrating at least one example of a network environment in which one or more examples of communications devices may find application.

According to at least one aspect of the present disclosure, communications devices are provided that are adapted to decode a convolutional coded bit stream according to one or more of the features disclosed herein. FIG. 1 is a block diagram illustrating at least one example of a network environment in which one or more examples of communications devices may find application. The wireless communication system 100 is adapted to facilitate wireless communications between a plurality of wireless communications devices, including base stations 102 and access terminals 104. The wireless communication system 100 can further include one or more base station controllers (BSC) 106, and a core network 108 providing access to a public switched telephone network (PSTN) (e.g., via a mobile switching center/visitor location register (MSC/VLR)) and/or to an IP network (e.g., via a packet data switching node (PDSN)).

The wireless communications devices (e.g., the base stations 102 and access terminals 104) may be adapted to interact with one another through wireless signals. In some instances, such wireless interaction may occur on multiple carriers (waveform signals of different frequencies). Multi-carrier transmitters can transmit modulated signals simultaneously on the multiple carriers. Each modulated signal may be a CDMA signal, a TDMA signal, an OFDMA signal, a Single Carrier Frequency Division Multiple Access (SC-FDMA) signal, etc. Each modulated signal may be sent on a different carrier and may carry control information (e.g., pilot signals), overhead information, data, etc.

The base stations 102 may wirelessly communicate with the access terminals 104 via a base station antenna. The base stations 102 may each include a device that facilitates wireless connectivity (for one or more access terminals 104) to a communications network. The base stations 102 may also be referred to by those of ordinary skill in the art as access points, base transceiver stations (BTS), radio base stations, radio transceivers, transceiver functions, basic service sets (BSS), extended service sets (ESS), Node Bs, femto cells, pico cells, and/or some other suitable terminology.

The base stations 102 are configured to communicate with the access terminals 104 under the control of the base station controller 106 via multiple carriers. Each of the base stations 102 can provide communication coverage for a respective geographic area. The coverage area 110 for each base station 102 here is identified as cells 110-a, 110-b, or 110-c. The coverage area 110 for a base station 102 may be divided into sectors (not shown, but making up only a portion of the coverage area). In a coverage area 110 that is divided into sectors, the multiple sectors within a coverage area 110 can be formed by groups of antennas with each antenna responsible for communication with one or more access terminals 104 in a portion of the cell.

The access terminals 104 may be dispersed throughout the coverage areas 110, and may wirelessly communicate with one or more sectors associated with each respective base station 102. An access terminal 104 may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, a user equipment (UE), a mobile terminal, a wireless terminal, a remote terminal, a handset, a terminal, a user agent, a mobile client, a client, a machine-to-machine device, or some other suitable terminology. Some non-limiting examples of access terminals 104 include mobile phones, pagers, wireless modems, personal digital assistants (PDAs), personal information managers (PIMs), personal media players, palmtop computers, laptop computers, tablet computers, televisions, appliances, e-readers, digital video recorders (DVRs), and/or other communication/computing devices which communicate, at least partially, through a wireless or cellular network.

The wireless communications devices (e.g., base stations 102 and access terminals 104) may wirelessly communicate information by transmitting binary bits over an air interface from one device to another. To compensate for bit errors caused by noise and interference over the air interface, the wireless communications devices may implement channel coding to provide for error detection and correction. For instance, in examples where the wireless communication system 100 is adapted to implement Global System for Mobile Communications (GSM) radio technology, the wireless devices may employ a half-rate (½-rate) convolutional coding scheme. For example, on a common control channel, 228 bits of data (e.g., 184 information bits, a 40-bit CRC checksum calculated to verify the correct transmission of at least some of the information bits, and 4 tail bits) can be half-rate convolutional coded to obtain a 456-bit data block. The 456-bit data block may be block interleaved and mapped to four bursts of 114 bits.

The four bursts may be received at a wireless communications device, where the data stream is de-interleaved and decoded. According to at least one feature of the present disclosure, communications devices (e.g., the wireless communications devices in the system 100), can be adapted to decode a convolutional coded bit stream employing a priori information. Such a priori information may be determined from a relationship between each information bit and two or more coded data bits of the convolutional coded bit stream.

Although the network environment illustrated in FIG. 1 is a wireless communication network, it should be understood that the principles of the present disclosure may be applied to any wired and/or wireless communications system that employs convolutional coding of conveyed messages. Furthermore, although only half-rate convolutional coding is referred to herein, it will be apparent that various features of the present disclosure may find application with other convolutional coding schemes.

Figure 2:
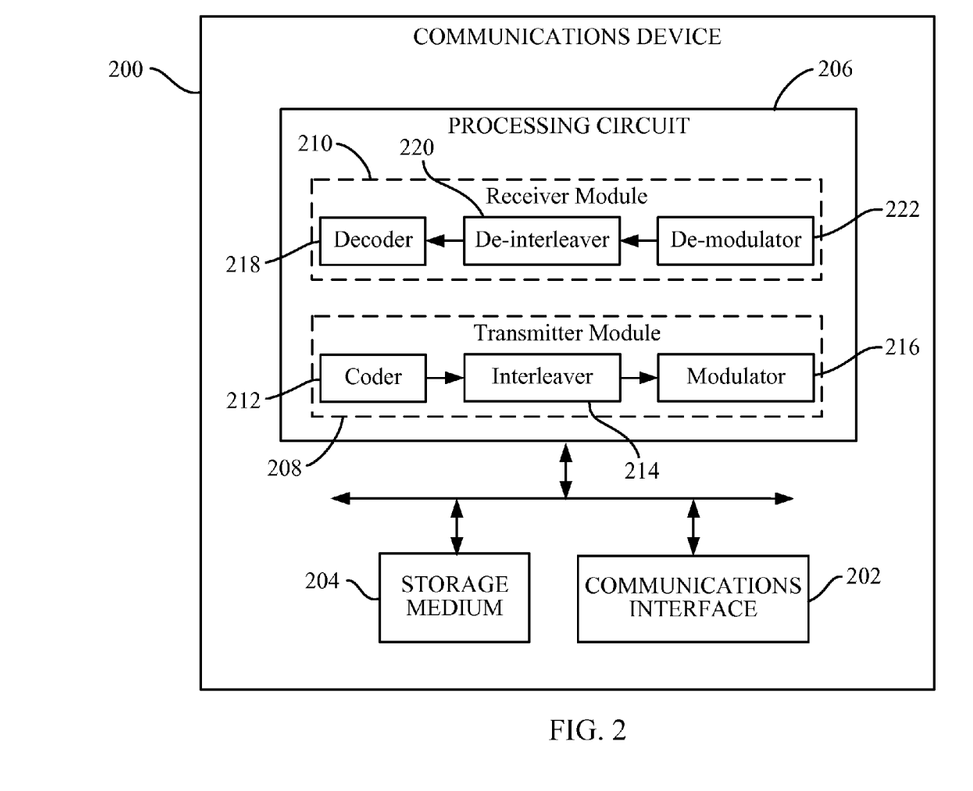
FIG. 2 is a block diagram illustrating select components of a communications device according to at least one example of the present disclosure.

Referring to FIG. 2, a block diagram is shown illustrating select components of a communications device 200 according to at least one example of the present disclosure. Such a communications device 200 may be implemented, for example as one or more of the wireless communications devices described above with reference to FIG. 1. The communications device 200 includes a communications interface 202 and a storage medium 204, both coupled to a processing circuit 206.

The communications interface 202 is configured as an interface for wireless and/or wired communications mediums. For example, the communications interface 202 may be configured to communicate information bi-directionally with respect to other communications devices in a network. The communications interface 202 may be coupled with an antenna (not shown) for wireless communications with wireless communications network, and/or may include as a network interface card (NIC), a serial or parallel connection, a Universal Serial Bus (USB) interface, a Firewire interface, a Thunderbolt interface, or any other suitable arrangement for communicating with respect to public and/or private networks, as well as some combination thereof. The communications interface 202 may include stand-along receivers and transmitters or be implemented in a transceiver arrangement according to some embodiments.

The storage medium 204 may represent one or more devices for storing programming and/or data, such as processor executable code or instructions (e.g., software, firmware), electronic data, databases, or other digital information. The storage medium 204 may also be used for storing data that is manipulated by the processing circuit 206 when executing programming. The storage medium 204 may be any available media that can be accessed by a general purpose or special purpose processor. By way of example and not limitation, the storage medium 204 may include a non-transitory computer-readable medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other non-transitory computer-readable mediums for storing information, as well as any combination thereof.

The storage medium 204 may be coupled to the processing circuit 206 such that the processing circuit 206 can read information from, and write information to, the storage medium 204. That is, the storage medium 204 can be coupled to the processing circuit 206 so that the storage medium 204 is at least accessible by the processing circuit 206, including examples where the storage medium 204 is integral to the processing circuit 206 and/or examples where the storage medium 204 is separate from the processing circuit 206.

Programming stored by the storage medium 204, when executed by the processing circuit 206, causes the processing circuit 206 to perform one or more of the various functions and/or process steps described herein. The processing circuit 206 is generally adapted for processing, including the execution of such programming stored on the storage medium 204. As used herein, the term "programming" shall be construed broadly to include without limitation executable instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. Throughout the present disclosure, any reference to programming in relation to one or more features of the processing circuit 206 can include programming stored by the storage medium 204.

The processing circuit 206 is arranged to obtain, process and/or send data, control data access and storage, issue commands, and control other desired operations. The processing circuit 206 may include circuitry configured to implement desired programming provided by appropriate media in at least one embodiment. For example, the processing circuit 206 may be implemented as one or more processors, one or more controllers, and/or other structure configured to execute executable programming Examples of the processing circuit 206 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 206 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 206 are for illustration and other suitable configurations within the scope of the present disclosure are also contemplated.

According to one or more aspects of the present disclosure, the processing circuit 206 may be adapted to perform any or all of the features, processes, functions, steps and/or routines for any or all of the communications devices described herein. As used herein, the term "adapted" in relation to the processing circuit 206 may refer to the processing circuit 206 being one or more of configured, employed, implemented, and/or programmed (e.g., in combination with programming stored by the storage medium 204) to perform a particular process, function, step and/or routine according to various features described herein.

According to at least one example of the communications device 200, the processing circuit 206 may include a transmitter module 208 and a receiver module 210 for facilitating bi-directional communications with one or more other devices. The transmitter module 208 may also be referred to as a transmit processor, a transmit circuit, a transmitter chain, or other suitable terminology by those skilled in the art. The transmitter module 208 may include circuitry and/or programming adapted to provide various signal processing functions for transmitting data. By way of example and not limitation, the transmitter module 208 can include a coder 212, an interleaver 214 and a modulator 216.

The coder 212 may represent circuitry and/or programming adapted to add error detection and correction information to a bit stream. For example, the coder 212 may employ a convolutional code algorithm to combine a plurality of information bits from a bit stream (or data stream) to obtain a plurality of coded bits (or symbols). By way of example and not limitation, the coder 212 may employ half-rate (½-rate) convolutional coding according to generator polynomials such as $G_0=1+D^3+D^4$, and $G_1=1+D+D^3+D^4$ to obtain the coded bits. Using these example generator polynomials, the coder 212 can calculate coded bits (or symbols) from the information bits $U_k$, $U_{k-1}$, $U_{k-2}$, $U_{k-3}$ and $U_{k-4}$ according to the following equations: $C_{2k}=U_k+U_{k-3}+U_{k-4}$ and $C_{2k+1}=U_k+U_{k-1}+U_{k-3}+U_{k-4}$, where the addition represents modulo 2 addition. These equations are depicted graphically by the diagram illustrated in FIG. 3. Other generator polynomials may also be used as desired.

Referring again to FIG. 2, redundancy added by the coder 212 can facilitate correction for a high number of faulty bits per frame. However, if several consecutive bits are changed during the transmission, a receiving device may not be able to correctly reconstruct an original frame from a received frame. To decrease this effect, the interleaver 214 may represent circuitry and/or programming adapted to change the bit order in a specified pattern over a plurality of bursts.

The coded and interleaved bit stream can subsequently be prepared for transmission by the modulator 216. The modulator 216 may represent circuitry and/or programming adapted to prepare the coded and interleaved bit stream for transmission via the communications interface 202. For example, in one or more implementations for wireless communications, the modulator 216 include circuitry and/or programming for mapping the bit stream to signal constellations based on various modulation schemes (e.g., Gaussian minimum shift keying (GMSK), binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. The symbols may then be employed by the modulator 216 in creating a frame structure. The modulator 216 can then apply various signal conditioning functions to the frames, such as amplification, filtering, and modulating the frames onto a carrier for transmission of the bit stream over a particular medium via the communications interface 202 (e.g., a wireless medium through an antenna associated with the communications interface 202).

Referring still to FIG. 2, the receiver module 210, which may also be referred to by those skilled in the art as a receive processor, receive circuit, receiver chain, or other suitable terminology, may include circuitry and/or programming adapted to provide various signal processing functions for recovering transmitted data. By way of example and not limitation, the receiver module 210 can include a decoder 218, a de-interleaver 220 and a de-modulator 222.

The de-modulator 222 may represent circuitry and/or programming adapted to recover information modulated onto the carrier. As a bit stream is received via the communications interface 202, the received bit stream is initially de-modulated by the de-modulator 222. In examples where the received communications include wireless transmissions, the de-modulator 222 may include circuitry and/or processing adapted to parse each frame, descramble and despread the symbols, and determine the most likely signal constellation points based on the modulation scheme.

The de-interleaver 220 may represent circuitry and/or programming adapted to re-order the bits into their original order. With the bit stream processed by the de-modulator 222 and re-ordered by the de-interleaver 220, the bit stream can be provided to the decoder 218.

Figure 4:
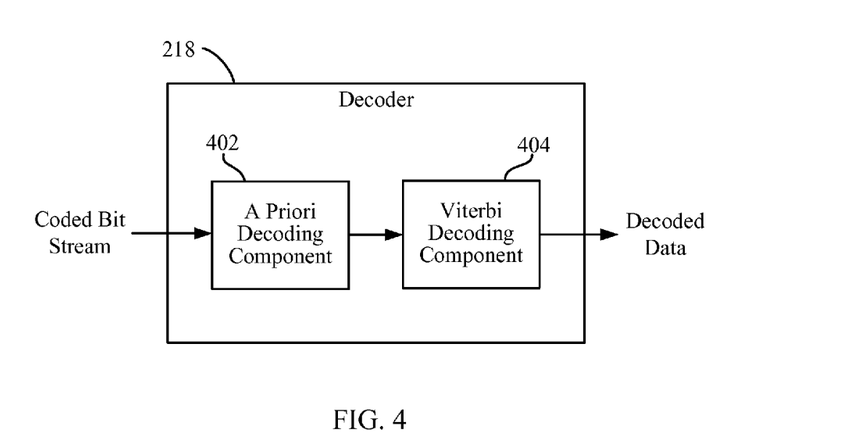
FIG. 4 is a block diagram illustrating select components of a decoder according to at least one example of the disclosure.

The decoder 218 may represent circuitry and/or programming adapted to determine information bits from the coded data bits (or symbols). According to at least one example, the decoder 218 may include an a priori decoding component 402 and a Viterbi decoding component 404, as depicted in FIG. 4, which is a block diagram illustrating select components of the decoder 218 according to at least one example.

The a priori decoding component 402 may represent circuitry and/or programming adapted to determine a priori information associated with each information bit. For instance, the a priori decoding component 402 can initially obtain a plurality of coded data bits from a convolutional coded bit stream. In at least some instances, the bit stream is convolutional coded according to one or more generator polynomials. This can enable determination of a a bit (e.g., an information bit) from a mathematic combination of two or more coded data bits of the convolutional coded bit stream. In such instances, the a priori decoding component 402 may be adapted to determine a priori information based on a mathematical combination of two or more coded data bits. A mathematical combination of two or more coded data bits may include modulo 2 addition, multiplication, and/or division of the two or more coded data bits. The particulars of such calculations may be determined from the equations used in convolutional coding data bits from the information bits prior to transmission. Other mathematical combinations may also be used in some embodiments.

The Viterbi decoding component 404 may represent circuitry and/or programming adapted to decode the convolutional coded bit stream using Viterbi decoding. According to at least one aspect of the present disclosure, the Viterbi decoding component 404 can obtain the a priori information determined by the a priori decoding component 402, and can employ the a priori information in calculating a binary value for each information bit.

Because the particulars of the calculations employed by the a priori decoding component 402 to determine a priori information associated with each information bit can be determined from equations used to perform the convolutional coding of the information bits prior to transmission, an example is provided below to illustrate how such determinations can be made and employed. Although the following example describes an implementation for specific generator polynomials, it should be understood that the underlying principles employed in this example can be applied for a variety of different generator polynomials.

In this non-limiting example, a bit stream may be half-rate (½-rate) convolutional coded according to the generator polynomials $G_0=1+D^3+D^4$, and $G_1=1+D+D^3+D^4$ to obtain the coded bits. Such generator polynomials may be employed in a wireless communications network for wireless transmissions between communications devices. For example, these generator polynomials may be employed in a wireless communications network adapted to implement radio technology such as Global System for Mobile Communications (GSM). As noted above, FIG. 3 illustrates a graphical depiction of the equations employed under these generator polynomials. In particular, the coded bits (or symbols) $C_{2k}$ and $C_{2k+1}$ are calculated from the information bits $U_k$, $U_{k-1}$, $U_{k-2}$, $U_{k-3}$ and $U_{k-4}$ according to the following equations: $C_{2k}=U_k+U_{k-3}+U_{k-4}$ and $C_{2k+1}=U_k+U_{k-1}+U_{k-3}+U_{k-4}$, where the addition represents modulo 2 addition.

Figure 3:
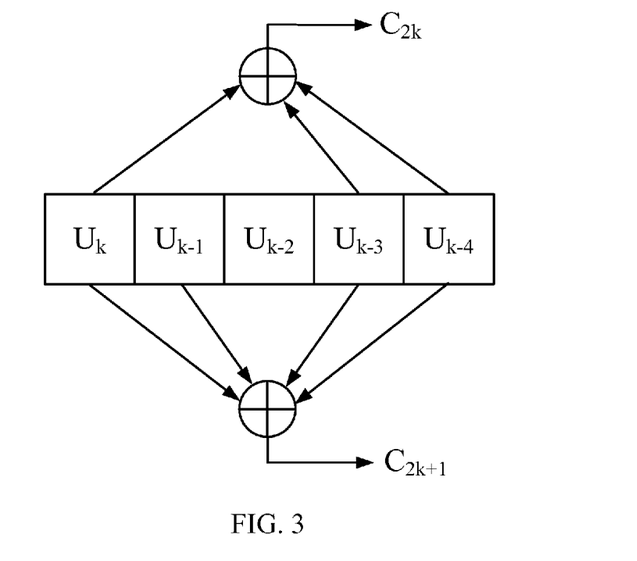
FIG. 3 is a diagram illustrating a graphical depiction of the equations for calculating half-rate convolutional coded bits $C_{2k}$ and $C_{2k+1}$ according to at least one example using generator polynomials $G_0=1+D^3+D^4$ and $G_1=1+D+D^3+D^4$.

These two equations can be expressed as the polynomials $C(D)=U(D)G(D)$, which can be expressed as $C(D)=U(D)[1+D^3+D^4, 1+D+D^3+D^4]$ by replacing the generator polynomials for $G(D)$.

Letting $F(D)$ be the right inverse polynomial of $G(D)$ results in $C(D)F(D)=U(D)G(D)F(D)=U(D)D^\alpha$, where the value for '$\alpha$' greater than or equal to zero (0) (i.e., $\alpha \geq 0$) represents the delay.

One candidate polynomial for $F(D)$ is $F(D)=[1\ 1]^T$, which results in $C(D)F(D)=U(D)[1+D^3+D^4,\ 1+D+D^3+D^4]\ [1\ 1]^T=U(D)D$.

A simple optimization involves calculating the modulo 2 sum of the coded bits $C_{2k}$ and $C_{2k+1}$ to obtain the information bit $U_{k-1}$ (i.e., $U_{k-1}=C_{2k}+C_{2k+1}$). Thus, the forgoing expressions show that each information bit $U_{k-1}$ can be determined by calculating the modulo 2 sum of $C_{2k}+C_{2k+1}$.

Another method for obtaining this equation may include solving for $U_{k-1}$ from the equations employed to calculate the coded data bits. As noted above, these equations are $C_{2k}=U_k+U_{k-3}+U_{k-4}$ and $C_{2k+1}=U_k+U_{k-1}+U_{k-3}+U_{k-4}$. Solving for $U_{k-1}$ in the second equation results in $U_{k-1}=U_k+U_{k-3}+U_{k-4}+C_{2k+1}$. Referring to the equations, it can be seen that the modulo 2 sum of the remaining information bits (i.e., $U_k+U_{k-3}+U_{k-4}$) is equal to $C_{2k}$. Thus, $U_k+U_{k-3}+U_{k-4}$ can be replaced by $C_{2k}$ to obtain $U_{k-1}=C_{2k}+C_{2k+1}$.

As shown in this example, each information bit $U_{k-1}$ is related to the two coded bits $C_{2k}$ and $C_{2k+1}$ in a manner that each information bit $U_{k-1}$ is determinable from a mathematical combination (e.g., the modulo 2 sum) of the two coded data bits $C_{2k}$ and $C_{2k+1}$. In view of this relationship, the a priori decoding component 402 can be adapted to determine a priori information associated with each information bit. For instance, conventional a priori information may include a log likelihood ratio (LLR) calculated from the probability that an information bit equals 1 over the probability that an information bit equals 0. That is, conventional a priori information may be expressed by the equation $$\log\left(\frac{P(u_k=1)}{P(u_k=0)}\right).$$

Considering the relationship where $U_{k-1}=C_{2k}+C_{2k+1}$, $U_{k-1}$ will be equal to 0 when $C_{2k}=0$ and $C_{2k+1}=0$ or when $C_{2k}=1$ and $C_{2k+1}=1$. Similarly, $U_{k-1}$ will be equal to 1 when $C_{2k}=1-0$ and $C_{2k+1}=0$ or when $C_{2k}=0$ and $C_{2k+1}=1$. In view of this simplified relationship, the ratio based on the probability that $U_{k-1}$ is equal to 1 over the probability that $U_{k-1}$ is equal to 0 can be expressed by the following equation $$\left(\frac{P(u_k=1)}{P(u_k=0)}\right) = \frac{P(c_{2k}=1, c_{2k+1}=0) + P(c_{2k}=0, c_{2k+1}=1)}{P(c_{2k}=0, c_{2k+1}=0) + P(c_{2k}=1, c_{2k+1}=1)},$$

which can also be expressed as $$\frac{P(c_{2k}=1)P(c_{2k+1}=0) + P(c_{2k}=0)P(c_{2k+1}=1)}{P(c_{2k}=0)P(c_{2k+1}=0) + P(c_{2k}=1)P(c_{2k+1}=1)}.$$

By dividing the numerator and the denominator by $P(C_{2k}=0)P(C_{2k+1}=0)$, and using the relationship $$\frac{P(c_{2k}=1)}{P(c_{2k}=0)} = \exp(L(c_{2k})),$$

the a priori information for the present non-limiting example can be determined according to the equation $$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))},$$

where $L(c_{2k})$ is the log-likelihood ratio (LLR) of $C_{2k}$ and $L(c_{2k+1})$ is the log-likelihood ratio (LLR) of $C_{2k+1}$. When the resulting value of $$\frac{P(u_{k-1}=1)}{P(u_{k-1}=0)}$$

is substantially greater than 1 (e.g., as a result of the probability that $U_{k-1}=0$ approaching 0), then the binary value for $U_{k-1}$ can be determined to likely be a 1. When the resulting value is substantially 0 (e.g., as a result of the probability that $U_{k-1}=1$ approaching 0), then the binary value for $U_{k-1}$ can be determined to likely be a 0. Thus, according to this example, a priori information can be obtained by simply determining the likely value of $C_{2k}$ and the likely value of $C_{2k+1}$. If both values are likely the same (e.g., both are a 1 or both are a 0), then a priori information can be obtained that $U_{k-1}$ is likely a 0. If both values are likely different (e.g., one is a 1 and the other is a 0), then a priori information can be obtained that $U_{k-1}$ is likely a 1.

Figure 5:
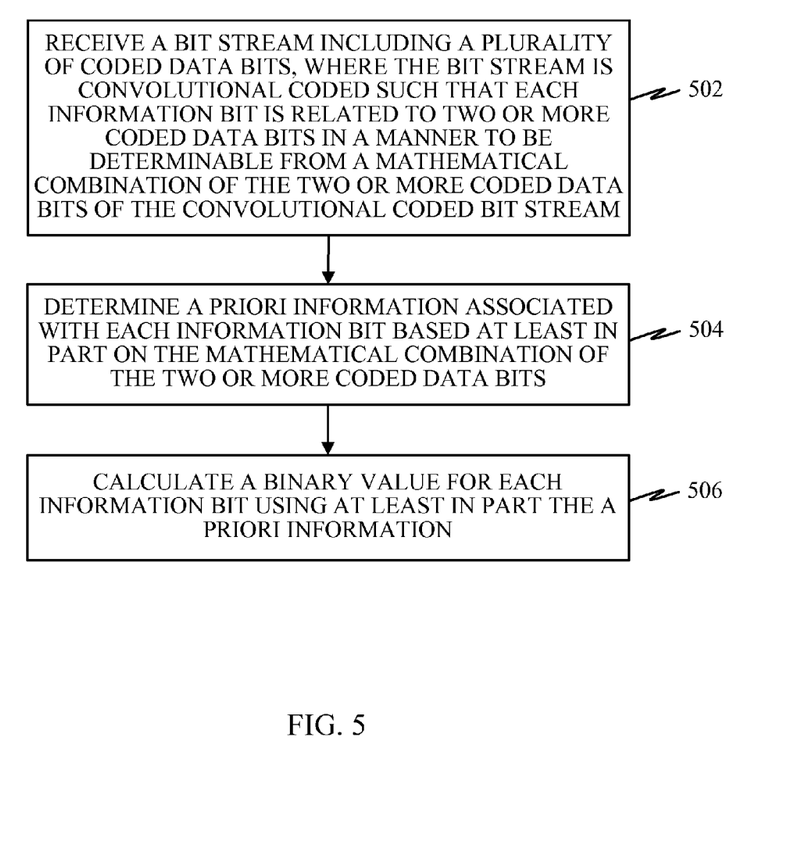
FIG. 5 is a flow diagram illustrating a method operational on a communications device including a decoder with an a priori decoding component and a Viterbi decoding component, according to at least one implementation.

According to one or more further aspects of the present disclosure, methods operational on a communications device are provided for decoding a convolutional coded bit stream according to one or more of the features described herein. Turning to FIG. 5, a flow diagram is illustrated showing an example of a method operational on a communications device, such as the communications device 200 including a decoder 218. With reference to FIGS. 2, 4, and 5, a bit stream is received at step 502. The bit stream includes a plurality of coded bits, where the bit stream is convolutional coded such that each information bit is related to two or more coded data bits in a manner to be determinable from a mathematical combination of the two or more coded data bits of the convolutional coded bit stream. The bit stream may be received by the communications device 200 via the communications interface 202 as either a wired or wireless transmission.

At step 504, the communications device 200 may determine a priori information associated with each information bit based at least in part on the mathematical combination of the two or more coded data bits. For example, the decoder 218 can obtain the coded bit stream, and can calculate a priori information associated with each information bit based at least in part on modulo 2 addition, multiplication, and/or division of the two or more coded data bits. By way of example and not limitation, the received bit stream may be convolutional coded according to the generator polynomials $G_0=1+D^3+D^4$ and $G_1=1+D+D^3+D^4$ such that each information bit $U_{k-1}$ is related to the coded data bits $C_{2k}$ and $C_{2k+1}$ in a manner to be determinable from a modulo 2 sum of $C_{2k}+C_{2k+1}$. In this example, the a priori decoding component 402 may determine a priori information associated with each information bit $U_{k-1}$ by determining a log-likelihood ratio from the equation $$\therefore \frac{P(u_{k-1} = 1 \mid c_{2k}, c_{2k+1})}{P(u_{k-1} = 0 \mid c_{2k}, c_{2k+1})} = \frac{\exp(L(c_{2k})) + \exp(L(c_{2k+1}))}{1 + \exp(L(c_{2k}))\exp(L(c_{2k+1}))}.$$

At step 506, the communications device 200 may calculate a binary value for each information bit using, as least in part, the a priori information. For example, the decoder 218 can calculate a binary value for each information bit. In at least one example, the Viterbi decoding component 404 of the decoder 218 may employ the a priori information in calculating the binary value for each information bit with a Viterbi decoding algorithm. In at least some examples, the Viterbi decoding component 404 may employ the a priori information by mapping the log-likelihood ratio (LLR) employing the a priori information together with other information such as extrinsic information. For instance, the Viterbi decoding component 404 may employ an algorithm where the log-likelihood ratio (LLR) is mapped by considering a log-likelihood ratio (LLR) of the a priori information added to log-likelihood ratio (LLR) of the extrinsic information, as described by the simplified equation $$MAP\ LLR = \log\left[\frac{P(U_{k-1} = 1 \mid \underline{c})}{P(U_{k-1} = 0 \mid \underline{c})}\right] =$$

log (a priori information) + log (extrinsic information).

By way of example and not limitation, the Viterbi decoding component 404 may map the log-likelihood ratio (LLR) according to the equation $$MAP\ LLR = \log\left[\frac{P(u_{k-1} = 1 \mid \underline{c})}{P(u_{k-1} = 0 \mid \underline{c})}\right] =$$

$$\log\left(\frac{\exp(L(c_{2k})) + \exp(L(c_{2k+1}))}{1 + \exp(L(c_{2k}))\exp(L(c_{2k+1}))}\right) + \log\left(\frac{\sum_U P(\underline{c}, \Sigma_{k-1} \mid u_{k-1} = 1)}{\sum_U P(\underline{c}, \Sigma_{k-1} \mid u_{k-1} = 0)}\right).$$

By identifying and employing a relationship between each information bit and two or more coded data bits (e.g., each information bit being determinable from a mathematical combination of the two or more coded data bits) as described herein, a coded bit stream can be more reliably and efficiently decoded by a communications device. Although specific details of one or more examples have been provided herein, it will be apparent to those skilled in the art that these concepts may be practiced without these specific details. For instance, one or more of the components, steps, features and/or functions illustrated in FIGS. 1, 2, 3, 4 and/or 5 may be rearranged and/or combined into a single component, step, feature or function or embodied in several components, steps, or functions. Additional elements, components, steps, and/or functions may also be added without departing from the scope of the present disclosure. The apparatus, devices and/or components illustrated in FIGS. 1, 2 and/or 4 may be configured to perform one or more of the methods, features, or steps described in FIGS. 3 and/or 5. The novel algorithms described herein may also be efficiently implemented in software and/or embedded in hardware.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The terms "machine-readable medium", "computer-readable medium", and/or "processor-readable medium" may include, but are not limited to portable or fixed storage devices, optical storage devices, and various other non-transitory mediums capable of storing, containing or carrying instruction(s) and/or data. Thus, the various methods described herein may be partially or fully implemented by instructions and/or data that may be stored in a "machine-readable medium", "computer-readable medium", and/or "processor-readable medium" and executed by one or more processors, machines and/or devices.

The various features of the embodiments described herein can be implemented in different systems without departing from the scope of the disclosure. It should be noted that the foregoing embodiments are merely examples and are not to be construed as limiting the disclosure. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A decoder, comprising:
   an a priori decoding component configured to:
      obtain a plurality of coded data bits from a bit stream that is convolutional coded according to generator polynomials $G_0 = 1 + D^3 + D^4$ and $G_1 = 1 + D + D^3 + D^4$, where 'D' represents a data stream and where each information bit $U_{k-1}$ is determinable from a modulo 2 sum of coded data bits $C_{2k}$ and $C_{2k+1}$, where 'k' represents an index value between 0 and a number 'n' based on a number of bits in a burst of the bit stream; and
      determine a priori information associated with each information bit $U_{k-1}$ based at least in part on the modulo 2 sum of the coded data bits $C_{2k}$ and $C_{2k+1}$; and
   a Viterbi decoding component configured to employ the a priori information in calculating a binary value for each information bit.

2. The decoder of claim 1, wherein the a priori decoding component is configured to determine the a priori information for each information bit $U_{k-1}$ by calculating a log-likelihood ratio (LLR) from the equation $$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

$$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

Where L ($C_{2k}$) is the log-likelihood ratio (LLR) of $C_{2k}$ and L($C_{2k+1}$) is the log-likelihood ratio (LLR) of $C_{2k+1}$.

3. A communications device, comprising:
a communications interface;
a storage medium; and
a processing circuit coupled with the communications interface and the storage medium, the processing circuit comprising a decoder configured to:
receive via the communications interface a bit stream including a plurality of coded data bits, wherein the bit stream is convolutional coded according to the generator polynomials $G_0=1+D^3+D^4$ and $G_1=1+D+D^3+D^4$ such that each information bit $U_{k-1}$ is related to coded data bits $C_{2k}$ and $C_{2k+1}$ in a manner to be determinable from a modulo 2 sum of coded data bits $C_{2k}$ and $C_{2k+1}$ where 'D' represents a data stream and 'k' represents an index value between 0 and a number 'n' based on a number of bits in a burst of the bit stream;
determine a priori information associated with each information bit $U_{k-1}$ based at least in part on the modulo 2 sum of the coded data bits $C_{2k}$ and $C_{2k+1}$; and
calculate a binary value for each information bit using at least in part the a priori information.

4. The communications device of claim 3, wherein the decoder comprises:
an a priori decoding component configured to determine the a priori information associated with each information bit; and
a Viterbi decoding component configured to calculate the binary value for each information bit using at least in part the a priori information.

5. The communications device of claim 3, wherein the communications interface is configured to facilitate wireless communications, wired communications, or both.

6. The communications device of claim 3, wherein the a priori information for each information bit $U_{k-1}$ comprises a log-likelihood ratio (LLR) determined from the equation $$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

Where L ($C_{2k}$) is the log-likelihood ratio (LLR) of $C_{2k}$ and L ($C_{2k+1}$) is the log-likelihood ratio (LLR) of $C_{2+1}$.

7. The communications device of claim 3, implemented as a wireless communications device.

8. The communications device of claim 7, wherein the wireless communications device comprises an access terminal or a base station.

9. A method operational on a communications device, comprising:
receiving a bit stream including a plurality of coded data bits, wherein the bit stream is convolutional coded according to the generator polynomials $G_0=1+D^3+D^4$ and $G_1=1+D+D^3+D^4$ such that each information bit $U_{k-1}$ related to coded data bits $C_{2k}$ and $C_{2k+1}$ in a manner to be determinable from a modulo 2 sum of the coded data bits $C_{2k}$ and $C_{2k+1}$, where 'D' represents a data stream and 'k' represents an index value between 0 and a number 'n' based on a number of bits in a burst of the bit stream;
determining a priori information associated with each information bit $U_{k-1}$ based at least in part on the modulo 2 sum of the coded data bits $C_{2k}$ and $C_{2k+1}$; and
calculating a binary value for each information bit using at least in part the a priori information.

10. The method of claim 9, wherein receiving the bit stream including the plurality of coded data bits comprises: wirelessly receiving the bit stream including the plurality of coded data bits.

11. The method of claim 9, wherein determining the a priori information associated with each information bit $U_{k-1}$ based at least in part on the modulo 2 sum of the coded data bits $C_{2k}$ and $C_{2k+1}$ comprises:
calculating a log-likelihood ratio (LLR) for each information bit $U_{k-1}$ from the equation $$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

Where L ($C_{2k}$) is the log-likelihood ratio (LLR) of $C_{2k}$ and L ($C_{2k+1}$) is the log-likelihood ratio (LLR) of $C_{2k+1}$.

12. A communications device, comprising:
means for receiving a bit stream including a plurality of coded data bits, wherein the bit stream is convolutional coded according to the generator polynomials $G_0=1+D^3+D^4$ and $G_1=1+D+D^3+D^4$ such that each information bit $U_{k-1}$ is related to coded data bits $C_{2k}$ and $C_{2k+1}$ in a manner to be determinable from a modulo 2 sum of the coded data bits $C_{2k}$ and $C_{2k+1}$, where 'D' represents a data stream and 'k' represents an index value between 0 and a number 'n' based on a number of bits in a burst of the bit stream;
means for determining a priori information associated with each information bit $U_{k-1}$ based at least in part on the modulo 2 sum of the coded data bits $C_{2k}$ and $C_{2k+1}$; and
means for calculating a binary value for each information bit using at least in part the a priori information.

13. The communications device of claim 12, wherein the a priori information for each information bit $U_{k-1}$ comprises a log-likelihood ratio (LLR) determined from the equation $$\therefore \frac{P(u_{k-1}=1 \mid c_{2k}, c_{2k+1})}{P(u_{k-1}=0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

Where L ($C_{2k}$) is the log-likelihood ratio (LLR) of $C_{2k}$ and L ($C_{2k+1}$) is the log-likelihood ratio (LLR) of $C_{2k+1}$.

14. A non-transitory machine-readable medium comprising instructions operational on a communications device, for:
obtaining a bit stream including a plurality of coded data bits, wherein the bit stream is convolutional coded according to the generator polynomials $G_0=1+D^3+D^4$ and $G_1=1+D+D^3+D^4$ such that each information bit $U_{k-1}$ related to coded data bits $C_{2k}$ and $C_{2k+1}$ in a manner to be determinable from a modulo 2 sum of the coded data bits $C_{2k}$ and $C_{2k+1}$, where 'D' represents a data stream and 'k' represents an index value between 0 and a number 'n' based on a number of bits in a burst of the bit stream;

determining a priori information associated with each information bit $U_{k-1}$ based at least in part on the modulo 2 sum of the coded data bits $C_{2k}$ and $C_{2k+1}$; and calculating a binary value for each information bit using at least in part the a priori information.

15. The machine-readable medium of claim 14, wherein the a priori information for each information bit $U_{k-1}$ comprises a log-likelihood ratio (LLR) determined from the equation $$\therefore \frac{P(u_{k-1} = 1 \mid c_{2k}, c_{2k+1})}{P(u_{k-1} = 0 \mid c_{2k}, c_{2k+1})} = \frac{\exp(L(c_{2k})) + \exp(L(c_{2k+1}))}{1 + \exp(L(c_{2k}))\exp(L(c_{2k+1}))}$$

Where L ($C_{2k}$) is the log-likelihood ratio (LLR) of $C_{2k}$ and L ($C_{2k+1}$) is the log-likelihood ratio (LLR) of $C_{2k+1}$.

* * * * *